United States Patent
Shono et al.

(10) Patent No.: US 7,209,885 B1
(45) Date of Patent: Apr. 24, 2007

(54) COMPRESSED CODE GENERATING METHOD AND COMPRESSED CODE DECOMPRESSING METHOD

(75) Inventors: Katsufusa Shono, Yokohama (JP); Takahiro Abe, Susono (JP)

(73) Assignee: Yazaki Corporation (JP)

( * ) Notice: Subject to any disclaimer, the term of this patent is extended or adjusted under 35 U.S.C. 154(b) by 710 days.

(21) Appl. No.: 09/786,138

(22) PCT Filed: Jun. 28, 2000

(86) PCT No.: PCT/JP00/04262

§ 371 (c)(1),
(2), (4) Date: Aug. 6, 2001

(87) PCT Pub. No.: WO01/01579

PCT Pub. Date: Jan. 4, 2001

(30) Foreign Application Priority Data

Jun. 28, 1999 (JP) .................................. 11-217647

(51) Int. Cl.
*G06K 9/36* (2006.01)

(52) U.S. Cl. ...................... 704/500; 704/501; 704/502; 704/503; 382/249; 382/248

(58) Field of Classification Search .................. 382/56, 382/232, 100, 249, 248, 243; 704/500–505
See application file for complete search history.

(56) References Cited

U.S. PATENT DOCUMENTS 4,941,193 A   7/1990 Barnsley et al.
5,065,447 A * 11/1991 Barnsley et al. ............ 382/249

FOREIGN PATENT DOCUMENTS

JP           10-143493         5/1998

* cited by examiner

*Primary Examiner*—Richemond Dorvil
*Assistant Examiner*—Huyen Vo
(74) *Attorney, Agent, or Firm*—Kilpatrick Stockton LLP

(57) ABSTRACT

A compressed-code generating method that is used for compressing information on characters including numerical data, sound and images, and a compressed-code expanding method that is used for restoring and expanding the compressed code generated by using the compressed-code generating method to the original information. Bit strings $\{y\}_1$ and $\{y\}_2$ are obtained respectively from a bit string $\{y\}$ of information to be compressed. A reversible loop that exists in chaos is operated to these obtained bit strings, thereby to execute a reversible compression/expansion of the information using the chaos.

3 Claims, 1 Drawing Sheet

COMPRESSED CODE GENERATING METHOD AND COMPRESSED CODE DECOMPRESSING METHOD

DESCRIPTION

1. Technical Field

This invention relates to a compressed-code generating method that is used for compressing information on characters including numerical data, sound and images, and a compressed-code expanding method that is used for restoring and expanding a compressed code that has been generated using this compressed-code generating method to original information.

2. Background Art

Information on characters including numerical data, sound and images is converted into two-value data, and is then stored in a recording medium or is transmitted to other places through a communication line, according to the needs. In this case, it is desired that the original information is efficiently compressed to meet the request for saving a memory space in the recording medium and reducing the communication traffics. The information that has been once compressed must be able to be restored and expanded to the original status for a person to be able to understand this information. When the restored expanded information coincides with the original information, this status is called that the information has been reversibly compressed/expanded. This request for a reversible compression/expansion exists in all fields of electronics at present. However, the efficient compression and the reversible restoration expansion are generally considered as mutually contradicting requests.

The ZIP has been known as one of code compression methods for digital files. The efficiency of this method is never satisfactory.

On the other hand, the JPEG and the MPEG have been known as methods for code compressing sound and images. According to these methods, however, it is not possible to efficiently compress information, and, further, the information is lost during a compression process. When the information has been once lost during the compression process, there is no way for reproducing the lost information, and the information is deteriorated unavoidably. In other words, it is impossible to achieve the reversible restoration expansion. Therefore, there is a risk that the information obtained after repeating the compression/expansion of information by a plurality of times using the code compression methods like the JPEG and the MPEG is considerably different from the original information.

Further, it is important that noise and echoes are not removed by regarding them as meaningless information when, for example, sound information is compressed. This similarly applies to the case of compressing image information. This is because the apparently meaningless information plays an important role in many cases. Particularly, in the case of compressing sentences and numerical data as character information, meaningful data is once converted into short numerical data having no meaning, thereby to compress the volume of information. In this case, when a 100% complete expansion is not guaranteed at the time of expanding the compressed data to recover the original meaningful information again, this information is changed to information having quite different contents or meaningless information.

DISCLOSURE OF THE INVENTION

This invention has been made according to the above-described request for the reversible compression/expansion.

It is an object of the present invention to provide a compressed-code generating method capable of efficiently compressing information on characters including numerical data, sound and images, in consideration of a status that it is possible to reversibly expand the compressed information.

Further, it is another object of the present invention to provide a compressed-code expanding method capable of reversibly expanding a compressed code generated by using the above compressed-code generating method.

According to the compressed-code generating method and the compressed-code expanding method relating to the present invention, the original information is not deteriorated to a level at which the original information cannot be reversibly restored, even when the information has been compressed/expanded by a plurality of times.

BRIEF DESCRIPTION OF THE DRAWING

Further characteristics and advantages of the invention of the present application will become more apparent from the following detailed explanation made with reference to the attached drawing.

In FIG. 1, arrows show a flow of a compression calculation. This shows a detailed example of a quantized initial value $Y_3(0)=2$

BEST MODE FOR CARRYING OUT THE INVENTION

Figure 1:
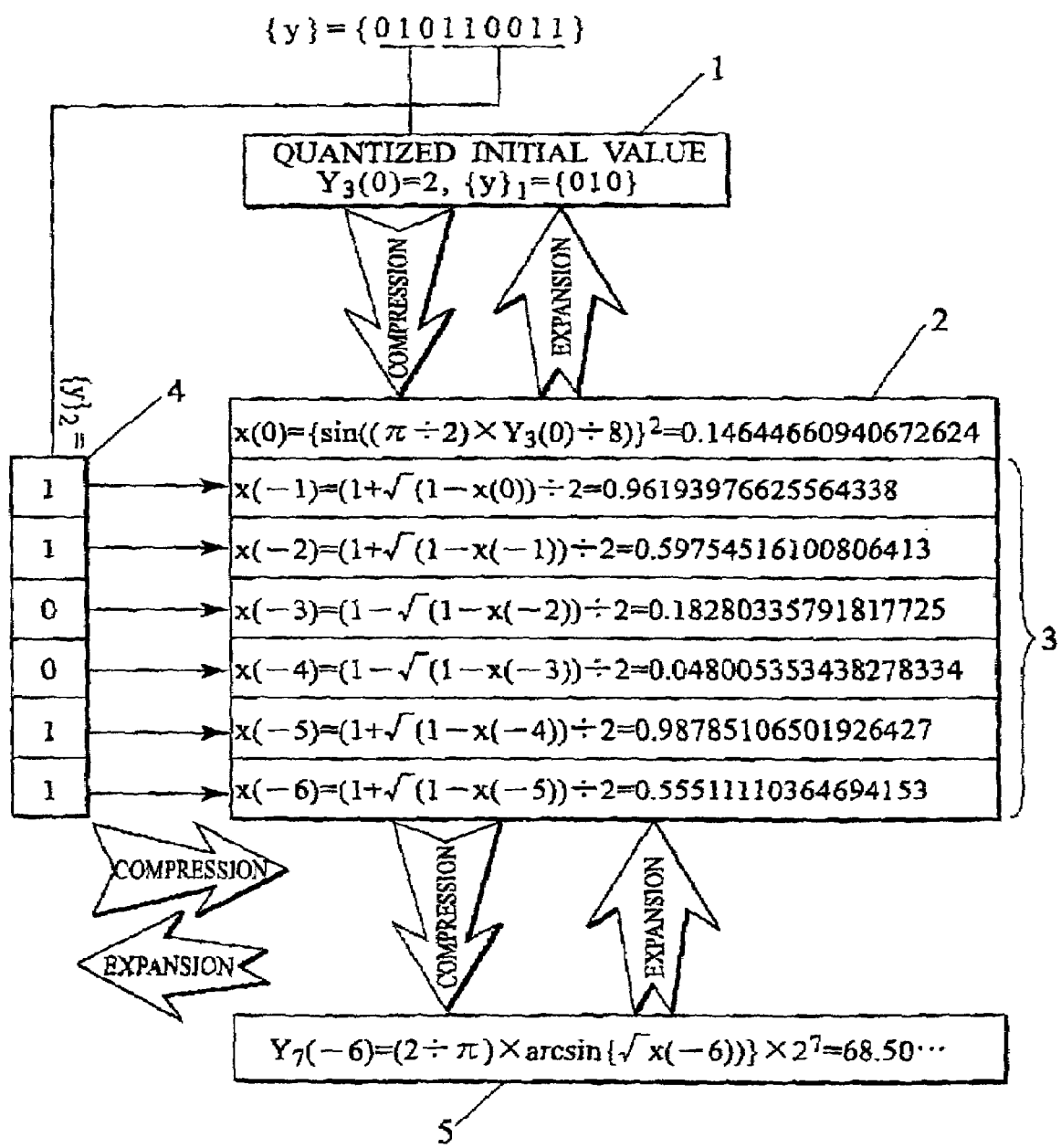
FIG. 1 is a diagram showing procedures of a compressed-code generating method and a compressed-code expanding method relating to the present invention.

A preferred embodiment of the present invention will be explained in detail below with reference to the attached drawing.

Prior to the explanation of the present invention, a background technique of the present invention will be made clear. Then, the explanation of the present invention will be progressed.

Logistic map $$x(t+1)=4x(t)\{1-x(t)\} \quad (1)$$

Feedback $$x(t)=x(t+1) \quad (2)$$

It has been well known that the chaos of the Riyapnoph index $\lambda=\ln 2=0.693\ldots$ is generated when the above expressions (1) and (2) are calculated in a double precision 52-bit binary decimal by using a digital computer 32-bit CPU currently available. So long as the calculation is carried out using the double precision 52-bit binary decimal, the recurrence of the calculation is guaranteed even when the calculation is carried out up to $t_{max}=2^{20}$. In this case, $x(t)$ means an internal status of an irrational number. The mapping of the expressions (1) and (2) can also be realized by an electronic circuit (an integrated circuit). However, the precision of the determination of the internal status $x(t)$ is substantially lower than that obtained by using the 32-bit CPU. In this case, it is possible to take a method of observing the internal status via a nonlinear analog/digital converter.

When the internal status x(t) (where t is a discrete time, t=0, 1, 2, □□□) of the mapping is observed by using an isomorphic transform and quantization expression $$Y(t)=2/\pi \times \arcsin(x(t))^{1/2} \times 2^{th} \quad (3)$$

Y(t) becomes a rational number, and order is observed in the chaos. An integer is included in the rational number. A quantized resolution n may be selected such that Y(t) becomes an integer. A chaos time-series Y(t)–t includes a fractal structure. The present invention utilizes the characteristics of this. In the following explanation, the isomorphic transform and quantized value of the quantized resolution n is expressed as $Y_n(t)$.

When an integer Y(t) has been given, this integer can be converted into the original irrational number x(t) by using the following expression that is an inverse transform expression of the expression (3).

$$x(t)=\{\sin \pi Y(t)/2^{n+1}\}^2 \quad (4)$$

In the present invention, in order to make it possible to carry out the inverse compression/expansion as the object of the present invention, inverse questions of the expression (1) to (4) are set. Thus, a reversible loop consisting of the inverse calculation and the forward calculation is structured.

In general, chaos is calculated toward the future (t>0). It has also been well known that the chaos generating circuit can be moved in only one future direction. On the other hand, when the irrational number x(t) is obtained from the quantum Y(t) as an optional integer by the expression (4), and an inverse calculation of the expression (1) is calculated as follows $$x(t-1)=(1 \pm (1-x)(t))^{1/2})/2 \quad (5)$$

it is possible to calculate a branching toward the past (t<0) (an inverse calculation process). In this case, when there is no means for determining a sign of plus or minus, the number of status increases exponentially each time when the step retroactive to the past increases. Thus, it becomes impossible to cope with the situation.

The embodiment of the present invention described below shows an example of a mode that a first bit string $\{y\}_1$ obtained from an information bit string $\{y\}$ to be compressed gives a quantized initial value of the inverse calculation, and a second bit string $\{y\}_2$ plays a role of determining a sign of plus or minus of the inverse calculation. The sign of plus or minus can be determined in any manner. When it is possible to device (select) plus or minus by any method regardless of a method of determining the sign of plus or minus, it is possible to go back to the past while determining the status of an inverse branching.

EMBODIMENT

A preferred mode of a compressed-code generating method and a compressed-code expanding method relating to the present invention will be explained below with reference to FIG. 1.

At step 1, a three-bit code $\{y\}_1=\{010\}$ is obtained from an information bit string $\{y\}$ to be compressed. Then, a quantized initial value $Y_3(0)=2$ that becomes an integer is calculated by giving a binary weight corresponding to the three-bit code $\{y\}_1$.

At step 2, an internal status x(0) that becomes an irrational number is obtained by giving an integer $$Y_3(0)=2$$

and n=3 to the inverse transform expression (4) of isomorphic transform and quantization respectively.

At steps 3 to 4, the calculation of the inverse calculation expression (5) of the logistic map is sequentially executed by the number of bits (six in the present embodiment) held by the second bit string $\{y\}_2$, based on the internal status (52-bit binary decimal)x(0) that becomes the irrational number obtained at step 2. A sign is selected according to a value of the second bit string $\{y\}_2=\{110011\}$ obtained from the information bit string $\{y\}$ to be compressed. FIG. 1 shows one example that the bit "1" corresponds to the plus (+) sign, and the bit "0" corresponds to the minus (−) sign. This $\{y\}_2$ may be a bit string of information that continues from $\{y\}_1$, or any other selection for $\{y\}_2$ can be permitted.

Specifically, at steps 3 to 4, the internal status x(0) that becomes an irrational number obtained at step 2 is given to the right-hand side of the inverse calculation expression (5) of the logistic map. Further, the sign "+" that follows the header value "1" in the second bit string $\{y\}_2$ is selectively given to the right-hand side of the expression (5). Thus, an internal status x(−1) retroactive to the past is obtained. Next, the internal status x(−1) retroactive to the past is given to the right-hand side of the inverse calculation expression (5) of the logistic map. Further, the sign "+" that follows the second value "1" in the second bit string $\{y\}_2$ is selectively given to the right-hand side of the expression (5). Thus, an internal status x(−2) retroactive to the past is obtained. In a similar manner, the internal statuses x(−1), x(−2), x(−3), x(−4), x(−5), and x(−6) retroactive to the past by the number of bits (six in the present embodiment) of the second bit string $\{y\}_2$ are calculated respectively.

At step 5, when the data retroactive to the sixth generation has been obtained, the isomorphic transform and quantized value of the internal status x(31 6) converges to an integer (=68) plus 0.5000 □□□ when the quantized resolution n=7. The internal status x(0) that becomes an irrational number is obtained from the quantized initial value $Y_3(0)$, and the calculation of the inverse calculation expression (5) of the logistic map is executed according to the second bit string $\{y\}_2$. Thus $Y_7(−6)$ is obtained using the isomorphic transform and quantization expression (3). In this case, an integer (=68) (this means a value excluding 0.5) becomes a compressed code.

When the quantized initial value $Y_3(0)$ is 0, $Y_7(−8)$ becomes a converged compressed code. When the quantized initial value $Y_3(0)$ is 1, $Y_7(−5)$ becomes a converged compressed code. When the quantized initial value $Y_3(0)$ is 2, $Y_7(−6)$ becomes a converged compressed code. When the quantized initial value $Y_3(0)$ is 3, $Y_7(−5)$ becomes a converged compressed code. When the quantized initial value $Y_3(0)$ is 4, $Y_7(−7)$ becomes a converged compressed code. When the quantized initial value $Y_3(0)$ is 5, $Y_7(−5)$ becomes a converged compressed code. When the quantized initial value $Y_3(0)$ is 6, $Y_7(−6)$ becomes a converged compressed code. When the quantized initial value $Y_3(0)$ is 7, $Y_7(−5)$ becomes a converged compressed code.

In the above example, when the quantized initial value $Y_3(0)$ is 2, the three bits of the quantized initial value bit string $Y_1$ as the information bit string to be compressed and the six bits of the code selection bit string $\{y\}_2$ are added together to nine bits. Then, the nine bits are compressed by two bits to seven bits of the compressed code $Y_7(−6)$.

The above explains the process of generating a compressed code.

On the other hand, the expansion processing of a compressed code is a process opposite to the process of generating a compressed code. Therefore, the process opposite to the arrows shown in FIG. 1 is carried out. First, an irrational number x(−6) is obtained by the inverse transform expression (4) of isomorphic transform and quantization of $Y_7(-6)$. In this case, it is necessary to have 0.500 □□□ added to the integer.

An internal status value of x(0) is obtained from an irrational number x(−6) by the sequential calculation expressions (1) and (2) of the logical map. During this process, $\{y\}_2$ is restored when n=1 of the isomorphic transform and quantization expression (3) is obtained.

In the isomorphic transform and quantization expression (3) of the quantized initial value x(0), the binary code string three bits of the integer $Y_3(0)$ substituted with n=3 is $\{y\}_1$ that is to be restored. The original information $\{y\}_1$ and $\{y\}_2$ can be restored in this way.

In the present invention, a compression factor is not fixed. The compression factor depends on a data structure of the information to be compressed. This is one of the characteristics of a reversible compression/expansion using chaos.

In the above embodiment, after the nine-bit information $\{y\}$=(010110011) has been compressed to a seven-bit compressed code, the original information is obtained by expanding this compressed code. This is one example of carrying out a reversible compression/expansion. It is not possible to device indiscriminately the precision of the forward and inverse calculations of an irrational number x(0), and calculation precision of the isomorphic transform and quantization and inverse conversion, or how to select $\{y\}_1$ and $\{y\}_2$ for binary decimal 52 bits. These also depend on the data structure of the information to be compressed.

The isomorphic transform and quantization of the logistic map is a linear conversion of the integer Y(t) as a result. A fine structure within a linear quantum also keeps a linear relationship. Quanta (integers) are all fair including a complementary relationship. The principle of guaranteeing the complete restoration lies in this.

In the above, there has been explained one loop for obtaining $\{y\}_1$ and $\{y\}_2$ respectively from the bit string $\{y\}$ of the information to be compressed, compressing them into seven bits and expanding the compressed bits. When this method is repeatedly carried out to all other $\{y\}_1$ and $\{y\}_2$, a first compression finishes. A second compression is carried out based on a result of the first compression. Third and subsequent compressions are also carried out similarly. For restoring the original information, it is needles to mention that it is necessary to repeat the expansion by the number of repetition of the compression.

Finding a reversible loop in chaos is a necessary condition for establishing a chaos industrial technology. A chaos block encryption and a chaos stream encryption are examples to which an inter-quantum reversible process has been applied. The reversible compression/expansion using chaos according to the present invention is a chaos industrial technology that has been extended to a correspondence relationship in the quantum fine structure. This is because the nonlinear quantized observation or isomorphic transform and quantization of the logistic map and the inverse conversion are the measurement of linearity of the internal status as a result.

The embodiment of the present invention is based on the assumption that the computers available at present can calculate mantissa 52-bit binary decimals. The invention proposes the establishment of a chaos industrial technology by regarding that the computers currently available can calculate irrational numbers. However, when the calculation capacity of digital computers has improved, it is a matter of course that the various values of the present invention are rewriting to match this capacity improvement.

In the above explanation of the preferred embodiment of the invention of the present application, specific terms are used. These terms are used for the purpose of explaining the drawing. Therefore, it is needless to mention that they can be altered or revised within the range not deviating from the ideas and the scope of the claims.

INDUSTRIAL APPLICABILITY

As explained above, the compressed-code generating method and the compressed-code expanding method relating to the present invention can be applied to the compression and expansion of information on characters including numerical data, sound and images. Particularly, they can be applied to the information that requires a reversible compression/expansion. The present invention can exhibit particularly excellent effects in this application field.

The invention claimed is:

1. A method that is used for compressing information, the method comprising:
   receiving a sound signal, an image signal or a data signal;
   converting the sound signal, the image signal or the data signal into a binary code bit string $\{y\}$;
   obtaining first and second bit strings $\{y\}_1$ and $\{y\}_2$ respectively from the binary code bit string $\{y\}$;
   defining a quantized initial value Y(0) by giving a binary weight to the first bit string $\{y\}_1$;
   obtaining an internal status x(0) using the quantized initial value Y(0) and n in a right-hand side of an inverse transform of isomorphic transform and quantization expression, $$x(0)=\{\sin \pi Y_n(0)/2^{n+1}\}^2$$

(where n is a quantized resolution of the first bit string);
   substituting the obtained internal status x(0) in a right-hand side of an inverse calculation expression of a logistic map, $$x(t-1)=(1\pm(1-x(t)^{1/2})/2$$

(where t is a discrete time), and selecting a sign of positive or negative in the right-hand side of the inverse calculation expression according to a binary value of the second bit string $\{y\}_2$, thereby obtaining a past retroactive internal status, the substituting and selecting steps sequentially executed by the number of bits of the second strings $\{y\}_2$;
   generating a compressed code Y(−τ) by using a resultant internal status x(−τ) and m in a right-hand side of an isomorphic transform and quantization expression, $$Y(-\tau)=2/\pi\times\arcsin(x(-\tau))^{1/2}\times2^m$$

(where m is a newly defined quantized resolution of the second bit string, and τ is a discrete time newly defined for the above t); and
   outputting the compressed code Y(−τ),
   wherein a length of the compressed code Y(−τ) is less than a length of the bit string $\{y\}$.

2. The method recited in claim 1, further comprising:
   receiving the compressed code Y(−τ);
   obtaining the internal status x(−τ) using the compressed code Y(−τ) and n is an inverse transform isomorphic transform and quantization, $$x(-\tau)=\{\sin \pi Y(-\tau)/2^{n+1}\}^2$$

obtaining an internal status using the internal status x(−τ) in a right-hand side of forward calculation expressions of a logistic map $$x(t+1)=4x(t)\{1-x(t)\} \quad (1)$$

$$x(t)=x(t+1) \quad (2)$$

which is executed repeatedly up to an internal status x(0);

restoring and expanding the second bit string $\{y\}_2$ by sequentially using the internal status x(t) and m in a right-hand side of an isomorphic transform and quantization expression, $$Y(t)=2/\pi \times \arcsin(x(t))^{1/2} \times 2^m$$

restoring and expanding the first bit string $\{y\}_1$ by sequentially using the internal status x(0) and m in the right-hand side of the isomorphic transform and quantization expression;

outputting the restored first bit string $\{y\}_1$ and second bit string $\{y\}_2$;

obtaining the binary code bit string $\{y\}$ from the restored first bit string $\{y\}_1$ and second bit string $\{y\}_2$; and converting the binary code bit string $\{y\}$ to the sound signal, the image signal or the data signal,

3. The method of claim 1 wherein the sign of the right-hand side of the inverse calculation expression of the logistic map is positive when the value of the second bit string is 1 and negative when the value is 0.

* * * * *